United States Patent [19]
Atriss et al.

[11] Patent Number: 5,278,522
[45] Date of Patent: Jan. 11, 1994

[54] HIGH FREQUENCY VOLTAGE CONTROLLED OSCILLATOR

[75] Inventors: Ahmad H. Atriss, Chandler; Benjamin C. Peterson, Tempe, both of Ariz.

[73] Assignee: Codex, Corp., Mansfield, Mass.

[21] Appl. No.: 978,602

[22] Filed: Nov. 19, 1992

[51] Int. Cl.[5] .................................. H03B 27/00
[52] U.S. Cl. ................................ 331/57; 331/1 A; 331/34; 331/108 A; 331/116 FE; 307/594; 307/595; 307/597; 307/602; 307/603; 307/605; 307/606
[58] Field of Search .................. 331/1.A, 25, 34, 57, 135, 116EE, 328/55; 307/594, 307/595, 597, 602, 603, 606, 271, 246, 260

[56] References Cited

U.S. PATENT DOCUMENTS

| | | | |
|---|---|---|---|
| 3,931,588 | 1/1976 | Gehweiler | 331/57 |
| 4,091,335 | 5/1978 | Giolma et al. | 331/1 A |
| 4,388,536 | 6/1983 | Peil et al. | 307/268 |
| 5,061,907 | 10/1991 | Rasmussen | 331/57 |
| 5,081,428 | 1/1992 | Atriss et al. | 331/57 |
| 5,081,429 | 1/1992 | Atriss et al. | 331/57 |
| 5,208,888 | 7/1991 | Ray | 331/57 |

FOREIGN PATENT DOCUMENTS 56-86509  7/1981  Japan ................................ 331/57

*Primary Examiner*—Robert J. Pascal
*Assistant Examiner*—Arnold Kinkead
*Attorney, Agent, or Firm*—Robert D. Atkins

[57] ABSTRACT

A phase lock loop operates independent of temperature and process variation by digitally loading a VCO until reaching the desired operating frequency. The VCO reaches a high output frequency even under worst case processing by controlling multiple current mirrors to increase inverter switching current without slowing the response of the VCO to changes in loop node voltage. An Initialize-to-VDD circuit sets the loop node voltage to $V_{DD}$ so that the load control circuit need only increase loading to slow down the VCO to the desired operating frequency. A frequency range detector monitors the output frequency of the VCO and passes control signals to a load control circuit to activate digital loads and slow down the VCO to the desired operating frequency.

20 Claims, 8 Drawing Sheets 5,278,522

HIGH FREQUENCY VOLTAGE CONTROLLED OSCILLATOR

CROSS REFERENCE TO RELATED PATENT APPLICATIONS

This application is related to copending U.S. patent application 07/978,538, entitled "VOLTAGE CONTROLLED OSCILLATOR OPERATING WITH DIGITAL CONTROLLED LOADS IN A PHASE LOCK LOOP", filed Nov. 19, 1992, by Ahmad Atriss et al and assigned to the same assignee, Codex, Corp. This application is further related to copending U.S. patent application 07/978,588, now U.S. Pat. No. 5,247,215, entitled "FREQUENCY RANGE DETECTOR", filed Nov. 19, 1992, by Ahmad Atriss et al and assigned to the same assignee, Codex, Corp.

BACKGROUND OF THE INVENTION

The present invention relates in general to voltage controlled oscillators and, more particularly, to a high frequency voltage controlled oscillator.

A conventional phase lock loop (PLL) generally includes a phase detector for monitoring a phase difference between an input signal and an output signal of a voltage controlled oscillator (VCO). The phase detector generates an up control signal and a down control signal for a charge pump to charge and discharge a loop filter at a loop node at the input of the VCO. The loop voltage developed across the loop filter determines the output frequency of the VCO. The up and down control signals driving the charge pump set the proper loop filter voltage at the input of the VCO to maintain a predetermined phase relationship between the signals applied to the phase detector, as is well understood.

PLLs are widely used in data communications, local area networks in computer applications, microprocessors and data storage applications to control data transfers. PLLs are often implemented with Complementary Metal Oxide Semiconductor (CMOS) technology to provide low cost and low power operation allowing a system designer to extend the tracking range and frequency-aided acquisition. As the operating frequency of PLLs continue to increase to meet the demand for higher communication data rates, the system designer must deal with problems of temperature and manufacturing process variation affecting the operation of the PLL. The VCO is the primary temperature and process sensitive component affecting high frequency PLL operation.

A typical maximum operating frequency for a conventional VCO is 100 MHz under worst case processing. It is desirable for the VCO to operate at least 200 MHz with the loop node voltage at its maximum ($V_{DD}$), even under worst case processing and high temperature conditions based on operating environment and wafer characteristics. However, under the best case temperature and processing conditions, the same VCO design may operate at a much higher frequency, say 860 MHz, with the same loop node voltage $V_{DD}$. In fact, the entire frequency-gain curve (MHz/volt) of the VCO operation is affected by temperature and processing conditions. For example, the VCO frequency gain under worst case processing may be 17 MHz/volt at 200 MHz, while under best case processing conditions, the VCO frequency gain is 365 MHz/volt. Thus, the uncertainty in VCO output frequency as a function of temperature and process parameters given a loop node voltage, effects accuracy, stability, jitter and tuning range of the PLL.

Hence, a need exists for a VCO operating with a high output frequency because of the increasing demand for high data rates.

SUMMARY OF THE INVENTION

Briefly stated, the invention comprises a voltage controlled oscillator having an control input for receiving a control signal. The voltage controlled oscillator comprises a plurality of inverters serially coupled in a ring. A first current supply circuit includes a control input and first and second outputs for providing first and second currents. A second current supply circuit includes a control input and an output for providing a third current to a first conduction terminal of a first inverter. The control inputs receive the control signal. A first current mirror circuit includes an input coupled to the first output of the first current supply and an output coupled to a second conduction terminal of the first inverter. A second current mirror circuit includes an input coupled to the second output of the first current supply circuit and an output coupled to the second conduction terminal of the first inverter.

DETAILED DESCRIPTION OF THE PREFERRED EMBODIMENTS

Figure 1:
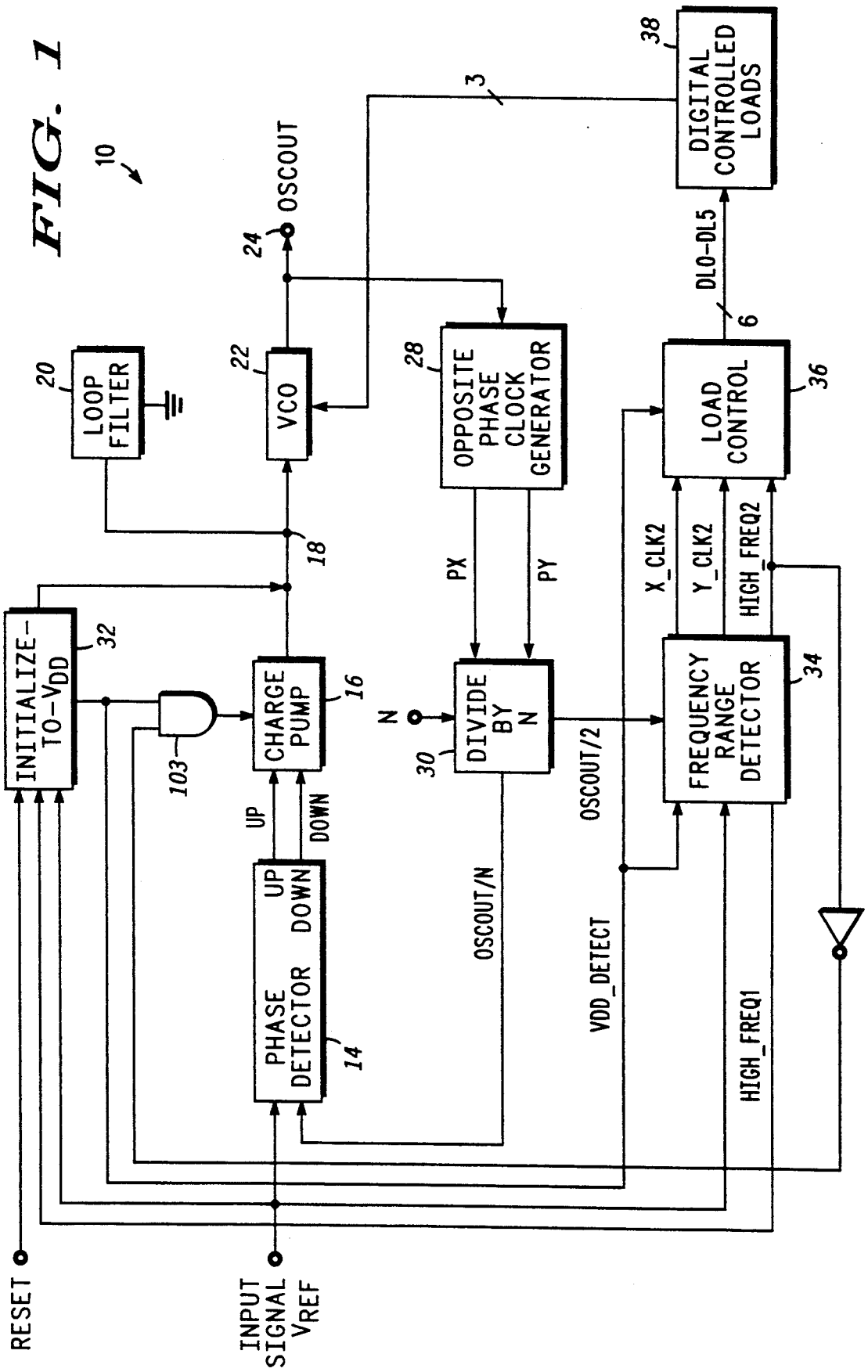
FIG. 1 is a block diagram illustrating a PLL.

A digital phase lock loop (PLL) 10 is shown in FIG. 1 suitable for manufacturing as an integrated circuit using conventional CMOS integrated circuit processes. A digital input signal $V_{REF}$ operating at say 2.0 MHz is applied at a first input of phase detector 14 to generate an UP control signal and a DOWN control signal for charge pump 16. The output of charge pump 16 drives loop node 18 for charging and discharging loop filter 20 comprising a capacitor (not shown) coupled between loop node 18 and ground potential. The loop voltage at loop node 18 controls VCO 22 for generating an oscillator signal OSCOUT at output 24. The OSCOUT signal is split into opposite phase clock signals PX and PY by opposite phase clock generator 28 and further frequency divided by programmable divide-by-N circuit 30 for providing an OSCOUT/N signal as applied at a second input of phase detector 14. Programmable divide-by-N circuit 30 receives an external control signal N to select the divisor N, e.g. N=100.

An UP control signal increases the loop voltage to increase the output frequency of VCO 22 while a DOWN control signal decreases the loop voltage to decrease the output frequency of VCO 22. The pulse width of the UP and DOWN control signals determines the amount of charge transferred to loop filter 20. The greater the phase difference between the input signal $V_{REF}$ and the OSCOUT/N signal, the greater the pulse width of the UP or DOWN control signal and the longer the charging current from charge pump 16 works to drive loop node 18 toward a voltage that alters the VCO frequency to minimize the phase difference. Thus, the mutually exclusive UP and DOWN control signals drive VCO 22 to maintain the predetermined phase relationship between the signals applied at the first and second inputs of phase detector 14.

Circuit 32 includes an output coupled to loop node 18 and operates in response to the input signal $V_{REF}$ to initialize loop node 18 to the positive power supply potential $V_{DD}$ (5.0 volts) at system start-up or system reset. Moreover, divide-by-N circuit 30 also provides an OSCOUT/2 signal, operating at one-half the rate of the OSCOUT signal, to frequency range detector 34 to detect whether the OSCOUT signal is within a predetermined frequency range. Frequency range detector 34 passes control signals to load control circuit 36 to generate load control signals DL0–DL5 for digital controlled loads 38. By monitoring the output frequency of VCO 22, frequency range detector 34 and load control circuit 36 adjust the capacitive loading and therefore operating speed of VCO 22 to obtain a predetermined output frequency given a particular loop node voltage. Thus, VCO 22 operates independent of temperature and process by way of adjustments made to its output frequency with digital controlled loads.

Figure 2:
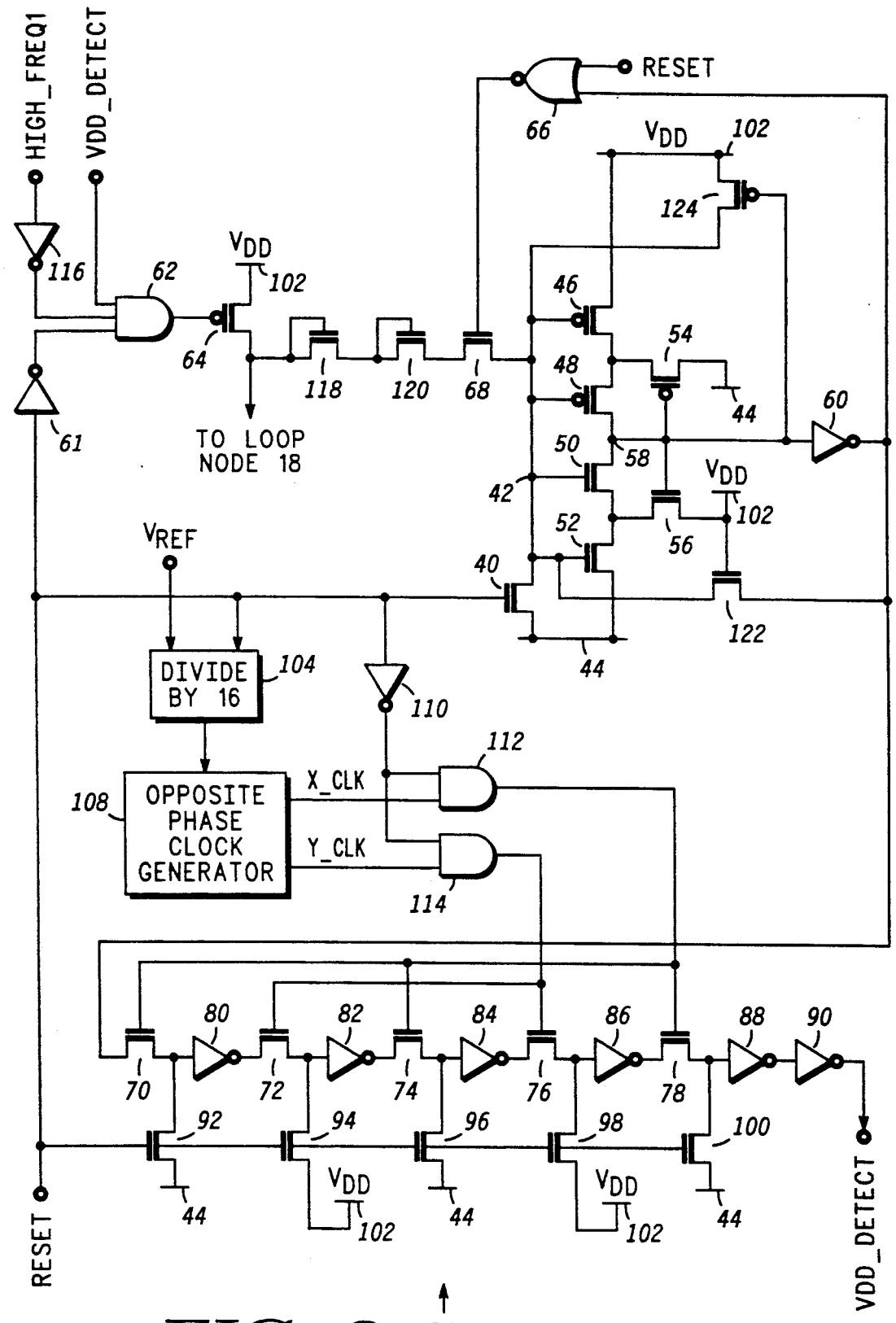
FIG. 2 is a schematic and block diagram illustrating the initialize-to-VDD circuit of FIG. 1.

Turning to FIG. 2, initialize-to-$V_{DD}$ circuit 32 is shown in further detail with an output coupled to loop node 18 for initializing VCO 22 to its maximum operating frequency at system start-up or system reset by setting loop node 18 to the maximum positive power supply potential $V_{DD}$. The VCO frequency spread between worst case processing and best case processing is maximum, varying between 200 MHz to 860 MHz, with the loop node voltage at $V_{DD}$. The wide frequency spread is important in determining the number of loads needed to reduce the VCO frequency to 200 MHz range independent of temperature and processing. The initialization process simplifies the overall design because the digital load control need only adjust VCO 22 toward a slower operating frequency.

At system reset, an active logic one RESET signal turns on transistor 40 to pull node 42 to a logic zero from power supply conductor 44 operating at ground potential. Transistors 46, 48, 50, 52, 54 and 56 operate as an inverter with hysteresis (Schmitt trigger) whereby a low level signal at node 42 less than the lower threshold of the Schmitt trigger 46–56 (1.6 volts) turns on transistors 46 and 48 and pulls node 58 at the input of inverter 60 to logic one and the output of inverter 60 to logic zero. Transistors 50 and 52 do not conduct at this time.

The active logic one RESET signal is inverted by inverter 61 to drive the output of AND gate 62 to logic zero and turn on transistor 64. However, the logic zero at the output of inverter 60 in combination with the logic one RESET, signal produces a logic zero at the output of NOR gate 66 and turns off transistor 68 to isolate node 42 from $V_{DD}$ when RESET is active. The logic one RESET signal also initializes the delay circuit comprising transistors 70, 72, 74, 76 and 78, and inverters 80, 82, 84, 86, 88 and 90. A logic one at the gates of transistors 92, 94, 96, 98 and 100 produces logic zeroes at the inputs of inverters 80, 84 and 88 from power supply conductor 44, and logic ones at the inputs of inverters 82 and 86 from power supply conductor 102 operating at a positive potential such as $V_{DD}$. The VDD_DETECT signal goes to logic zero following an even number of inversions from the output of inverter 60 given that the input of inverter 88 was set to logic zero during the active RESET signal. The logic zero VDD_DETECT signal is "AND'ed" with an inverted HIGH_FREQ2 signal from frequency detector 34 by way of AND gate 103 to disable charge pump 16, as shown in FIG. 1. A charge pump circuit with a disable feature is well known in the art of PLLs, for example by separately "AND-ing" the output signal of AND gate 103 with the UP control signal and the DOWN control signal to drive the charge and discharge transistors of charge pump 16.

Figure 3:
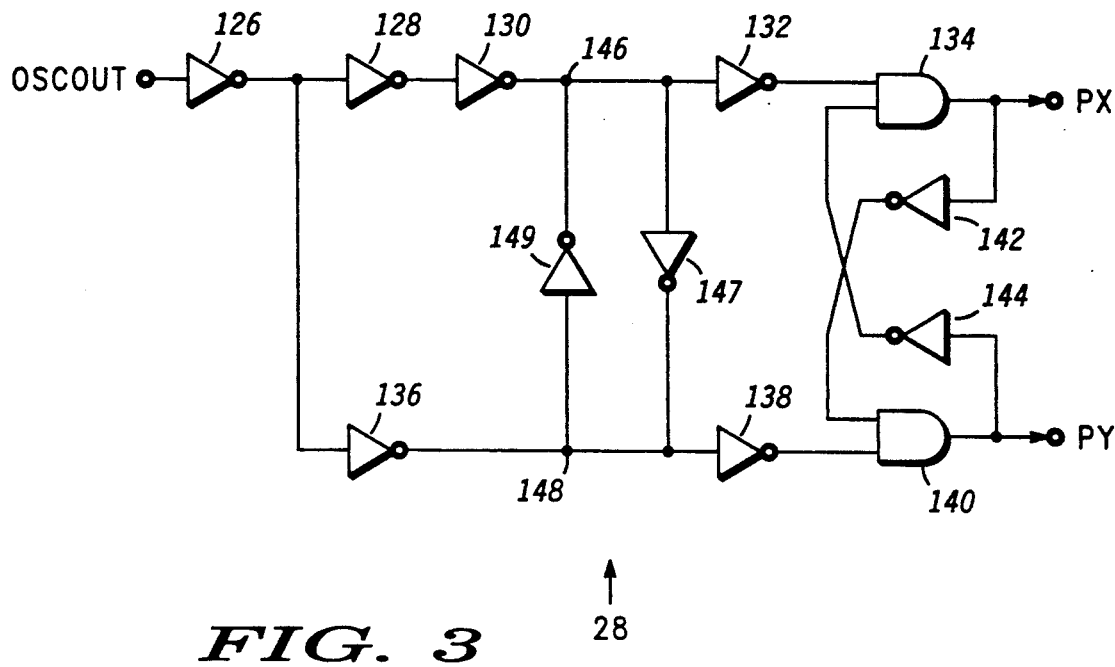
FIG. 3 is a schematic diagram illustrating the opposite phase clock generator of FIG. 1.

The 2.0 MHz input signal $V_{REF}$ is divided down by divide-by-N circuit 104 to 125 KHz after which opposite phase clock generator circuit 108 produces opposite phase clock signals X_CLK and Y_CLK. A divide-by-N circuit with N=16 is well known in the art. An embodiment of opposite phase clock generators 28 and 108 is shown in FIG. 3 where the OSCOUT signal from VCO 22 is applied through inverters 126, 128, 130 and 132 to a first input of AND gate 134. The output of inverter 126 is coupled through inverters 136 and 138 to a first input of AND gate 140. The output of AND gate 134 provides the PX clock signal as applied through inverter 142 to a second input of AND gate 140. Likewise, the output of AND gate 140 provides the PY clock signal as applied through inverter 144 to a second input of AND gate 134. The output of inverter 130 at node 146 is coupled through inverter 147 to the input of inverter 138, while the output of inverter 136 at node 148 is coupled through inverter 149 to the input of inverter 132.

When the OSCOUT signal switches to logic zero, the output of inverter 126 goes to logic one. Inverter 136 attempts to switch node 148 to logic zero before node 146 switches to logic one because node 148 is only two inverter delays away from the OSCOUT signal while node 146 is three inverter delays away. However, the transition of node 148 to logic zero is slowed by inverter 147 because node 146 is still logic zero two inverter delays after the OSCOUT signal changes to logic zero. Inverter 147 acts to hold node 148 at logic one until the output of inverter 130 changes state. A similar scenario follows when the OSCOUT signal switches to logic one. Thus, the transition of inverters 132 and 138 overlap 180° out-of-phase and cross approximately at the 50% mark, thereby overcoming the delay difference imposed by an unequal number of inverters between the OSCOUT signal and nodes 146 and 148.

When the output of inverter 132 is logic zero, the PX clock signal at the output of AND gate 134 goes to logic zero. AND gate 140 receives logic ones from the outputs of inverters 142 and 138 for providing a logic one PY clock signal. When the output of inverter 138 goes to logic zero, the PY clock signal goes to logic zero. AND gate 134 receives logic ones from the output of inverters 132 and 144 for providing a logic one PX clock signal. Hence, the PX and PY clock signals are opposite phase switching at substantially the 50% mark and operating at the frequency of the OSCOUT signal. The X_CLK and Y_CLK clock signals provided by clock generator 108 are likewise opposite phase switching at substantially the 50% mark and operating at the frequency of the $V_{REF}$ signal divided by sixteen.

Following system reset, the RESET signal goes to logic zero to turn off transistor 40 and release node 42 in FIG. 2. Transistors 92–100 no longer conduct. Inverter 110 applies a logic one at first inputs of AND gates 112 and 114, while second inputs of the same receive the X_CLK and Y_CLK signals, respectively. During the times that the X_CLK signal is logic one, transistors, 70, 74 and 78 conduct to pass the logic state from the previous inverter. During the times that the Y_CLK signal is logic one, transistors 72 and 76 conduct to pass the logic state from the previous inverter. Thus, the logic zero state at the output of inverter 60 following system reset passes through transistors 70–78 and inverters 80–90 after three clock periods of the X_CLK and Y_CLK signals. The VDD_DETECT signal remains at logic zero.

Assume HIGH_FREQ1 is logic one at the input of inverter 116. The logic zero VDD_DETECT and HIGH_FREQ1 signals keep the output of AND gate 62 at logic zero and transistor 64 conducting after the RESET signal becomes inactive. Transistor 64 sources current into loop node 18 to charge its potential toward the power supply potential $V_{DD}$ from conductor 102. The logic zero RESET signal drives the output of NOR gate 66 to logic one and turns on transistor 68. Transistors 118 and 120 are configured with their drains and gates coupled together such that the potential at node 42 is two gate-source junction potentials ($V_{GS} = 0.8$ volts) below loop node 18, neglecting the drain-source potential of transistor 68. Once the voltage at loop node 18 reaches say 4.0 volts, and node 42 is at the upper hysteresis threshold of Schmitt trigger 46–56, say 2.4 volts (4.0 volts − $2V_{GS}$), transistors 50 and 52 conduct and pull node 58 to logic zero. The output of inverter 60 switches to logic one.

The logic zero at node 58 also turns on transistor 54 to set the lower hysteresis threshold of Schmitt trigger 46–56 at the source of transistor 48. That is, node 42 must drop below 1.6 volts to switch node 58 back to logic one. Transistor 124 also conducts to pull node 42 to logic one from $V_{DD}$. The logic one at the output of inverter 60 clocks through transistors 70–78 during three periods of the X_CLK and Y_CLK signals and switches the VDD_DETECT signal to logic one indicating that loop node 18 is operating substantially at $V_{DD}$. Transistor 122 provides feedback to keep node 42 at logic one and the output of inverter 60 at logic one for a continuous logic one VDD_DETECT signal. The delay through transistors 70–78 provides extra time for loop node 18 to increase from 4.0 volts to substantially 5.0 volts. The delay may be increased or decreased as necessary for the particular application by adding or removing transistors like 70–78 and inverters like 80–88.

The first phase of the initialization process of PLL 10 is complete when loop node 18 reaches $V_{DD}$. The second phase involves adjusting the loading on VCO 22 to produce a known maximum output frequency, say 200 MHz, given the maximum loop node voltage $V_{DD}$. Once VCO 22 is properly loaded to oscillate at 200 MHz with loop node voltage at $V_{DD}$, PLL 10 may begin normal operation. Another RESET . signal starts the initialization process all over again when needed.

Figure 4:
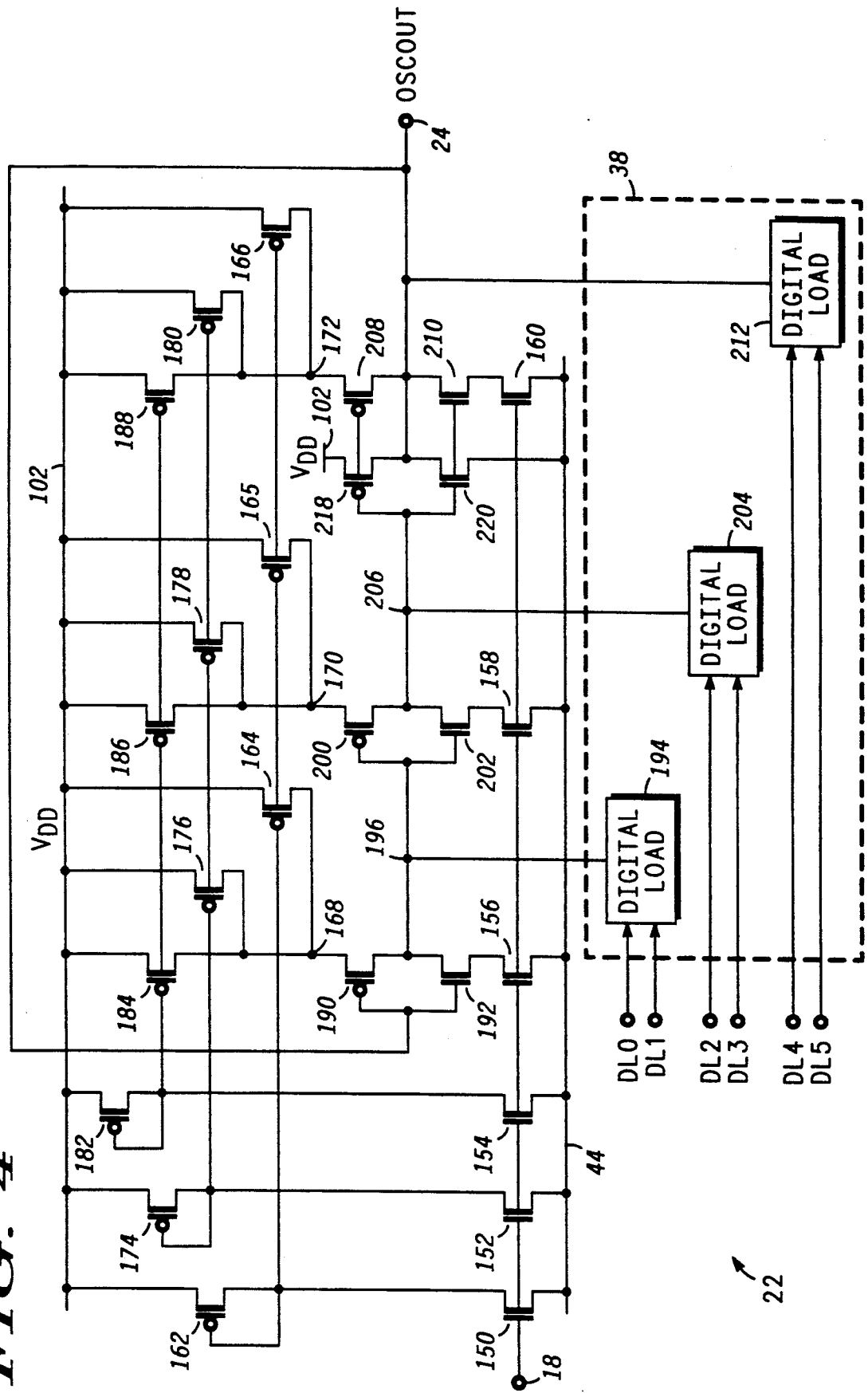
FIG. 4 is a schematic and block diagram illustrating the high frequency VCO of FIG. 1.

In FIG. 4, VCO 22 is illustrated as a ring oscillator with three current-gain controllable inverter stages and digital controlled loads 38 at the output of each inverter stage. The loop node voltage at loop node 18 is applied at the gates of current-source transistors 150, 152, 154, 156, 158 and 160. Transistor 162 operates as an input of a first current mirror circuit with three equal outputs at the drains of transistors 164, 165 and 166 connected to nodes 168, 170 and 172, respectively. The current flow through transistors 150 and 162 sets the $V_{GS}$ for transistors 164–166 to each conduct the same current. Likewise, transistor 174 operates as an input of a second current mirror circuit with three equal outputs at the drains of transistors 176, 178 and 180 connected to nodes 168, 170 and 172, respectively. The current flow through transistors 152 and 174 sets the $V_{GS}$ for transistors 176–180 to each conduct the same current. Transistor 182 operates as an input of a third current mirror circuit with three equal outputs at the drains of transistors 184, 186 and 188 connected to nodes 168, 170 and 172, respectively. The current flow through transistors 154 and 182 sets the $V_{GS}$ for transistors 184–188 to each conduct the same current.

Transistors 190 and 192 form a first inverter with the source of transistor 190 acting as a first conduction terminal coupled to node 168 while the source of transistor 192 is a second conduction terminal coupled to the drain of transistor 156. The drains of transistors 190 and 192 are coupled together to digital load 194 at node 196 for applying capacitive loading in response to digital load control signals DL0 and DL1. Transistors 200 and 202 form a second inverter coupled between node 170 and the drain of transistor 158. The drains of transistors 200 and 202 are coupled together to digital load 204 at node 206 for applying capacitive loading in response to digital load control signals DL2 and DL3. Transistors 208 and 210 form a third inverter coupled between node 172 and the drain of transistor 160. The drains of transistors 208 and 210 are coupled together to digital load 212 at output 24 for applying capacitive loading in response to digital load control signals DL4 and DL5.

The operation of a three inverter ring oscillator is well known in the art. Briefly, the output of the third inverter 208–210 is fed back to the input of the first inverter 190–192 causing the overall circuit to oscillate with each inverter stage providing 180° of phase shift. Transistors 218 and 220 are coupled between power, supply conductors 102 and 44 operate as an inverter like transistors 208–210 to compensate for mismatches between p-channel transistors 190, 200 and 208 and n-channel transistors 192, 202 and 210. Reducing the transistor mismatches help provide a 50% duty cycle for the OSCOUT signal. Further detail of the operation of transistors 218 and 220 is disclosed in U.S. Pat. No. 5,081,428 and is hereby incorporated by reference.

In VCO 22, current-source transistors 150 and 156–160 control the switching speed of inverting transistors 190–192, 200–202 and 208–210 through current mirror transistors 162–166. If the loop node voltage increases, transistors 150 and 156–162 conduct more current. The current flow through transistors 150 and 162 is mirrored through transistor 164. Thus, inverting transistors 190–192 conduct more current as the loop node voltage increases to charge and discharge the capacitance at the gates of transistors 200–202 allowing the latter to switch at a higher frequency. Transistors 165 and 158 also conduct more current through transistors 200-202 to charge and discharge the capacitance at the gates of transistors 208-210 allowing the latter to switch at a higher frequency. Likewise, transistors 166 and 160 sink and source more current through transistors 208-210 allowing transistors 190-192 to switch at a higher frequency. The overall effect is for VCO to generate a higher output frequency OSCOUT as the loop node voltage increases. A lower loop node voltage decreases the output frequency of VCO 22 by reducing the current flow through transistors 150 and 156-166 and the respective inverting transistor stages.

One technique of increasing the maximum output frequency of VCO 22 involves increasing the gate width and/or decreasing the gate length of the inverting transistors like 190-192, 200-202 and 208-210 whereby each conducts more current for a given gate voltage. Another approach is to increase the gate width and/or decrease gate length of current-source transistors like 150 and 156-166. It is important to minimize the loading at the gates of transistors 164-166 to ensure quick response to current changes in transistors 150 and 162 with the loop node voltage. There is an upper limit to this approach in that increasing the gate geometry also increases the gate capacitance and diffusion capacitance as seen by the previous inverter stage. The additional capacitance tends to slow the oscillation. The upper practical limit with CMOS devices is about 100 MHz under worst case processing.

A key feature of VCO 22 is the use of additional current mirror circuits to reduce the capacitive loading at the gates of transistors 164-166 while increasing the current flow through inverting transistors 190-192, 200-202 and 208-210. Accordingly, current-source transistors 152 aids in the control the switching speed of inverting transistors 190-192, 200-202 and 208-210 through current mirror transistors 174-180. If the loop node voltage increases, transistors 152 and 174 conduct more current which is mirrored through transistors 176-180. Likewise, current-source transistors 154 aids in the control the switching speed of inverting transistors 190-192, 200-202 and 208-210 through current mirror transistors 182-188. If the loop node voltage increases, transistors 154 and 182 conduct more current which is mirrored through transistors 184-188.

The summation current from transistors 164, 176 and 184 flowing into node 168 allows inverting transistors 190-192 to conduct three times the current to charge and discharge the capacitance at the gates of transistors 200-202 without increasing the capacitance at the gates of transistors 164, 176 and 184. Likewise, the summation current from transistors 165, 178 and 186 flowing into node 170 allows inverting transistors 200-202 to conduct three times the current to charge and discharge the capacitance at the gates of transistors 208-210 without increasing the capacitance at the gates of transistors 165, 178 and 186. Finally, the summation current from transistors 166, 180 and 188 flowing into node 172 allows inverting transistors 208-210 to conduct three times the current to charge and discharge the capacitance at the gates of transistors 190-192 without increasing the capacitance at the gate of transistors 166, 180 and 188. Transistors 150-154 and 162-188 are constructed with the same geometry such that each conducts a similar current given a value of loop node voltage. Transistors 156-160 are made three times the width/length ratio of transistors 150-154 to sink the summation currents flowing into nodes 168, 170 and 172, respectively.

Each current mirror circuit has its own input with separate current-source transistors 150-154. For example, transistors 176 and 184 do not load the gate of transistor 164. Similarly, transistors 164 and 184 do not load the gate of transistor 176, and transistors 164 and 176 do not load the gate of transistor 184. Yet, the summation of currents into node 168 allow inverting transistors 190-192 to switch the logic state at node 196 at a higher rate. By increasing the current flow through the inverting transistors without extra loading at the input of the current mirror circuits, which slows the response to loop node voltage changes, the desired result of increasing the maximum operating frequency of VCO 22 to 200 MHz under worst case processing is achieved.

It is understood that additional current mirror circuits could be added to further increase the current flow through the inverting transistor stages without increasing the capacitive load at the inputs of the current mirror circuits. Each current mirror circuit would comprise transistors like 150 and 162-166 connected to nodes 168-172, respectively. A further extension may include more inverter stages with corresponding outputs from each current mirror circuit. For example, five inverting transistor stages would require each current mirror circuit to have five outputs coupled one each to the source of the p-channel transistor of each inverter stage. Another option is to decrease the number of current mirror circuits to a minimum of two, e.g., transistors 150, 162-166 and transistors 152, 174-180.

Another feature of VCO 22 is the digital loading at nodes 196 and 206 and output 24. Frequency range detector 34 monitors the output frequency of VCO 22 and passes control signals DL0-DL5 to load control circuit 36 to activate digital loads 194, 204 and 212 and slow down VCO 22 to the desired operating frequency. Initialize-to-VDD circuit 32 sets the loop node voltage to $V_{DD}$ so that load control circuit 36 need only increase loading to slow down VCO 22 to the desired operating frequency of 200 MHz. Recall that VCO 22 is d signed to operate at 200 MHz for worst case processing. Thus, under worst case conditions, minimal or no additional loading is required. However, under better conditions, load control circuit 36 must reduce the switching speed of the VCO inverter stages by increasing the capacitive load.

For example, assume VCO 22 began operating at 400 MHz following system power-up. Frequency range detector 34 detects the higher than desired frequency and prompts load control circuit 36 to increase loading. Load control circuit 36 brings the DL0 load control signal to logic one and enables transmission gate 224 of FIG. 5. Transmission gate 224 may comprise p-channel and n-channel CMOS transistors (not shown) with their drains and sources coupled together. Inverter 226 complements the DL0 signal to enable the p-channel transistor. A first conduction terminal of transmission gate 224 is coupled to node 196. Capacitor 228 is coupled between a second conduction terminal of transmission gate 224 and power supply conductor 44. The loading at node 196 increases by the value of capacitor 228 through transmission gate 224. The output frequency of VCO 22 decreases because of the additional delay imposed by capacitor 228. If VCO 22 is still operating above the desired 200 MHz frequency, load control circuit 36 brings the DL1 signal to logic one and enables transmission gate 230. Inverter 232 enables the p-channel side of transmission gate 230 A first conduction terminal of transmission gate 230 is coupled to node 196. Capacitor 234 is coupled between a second conduction terminal of transmission gate 230 and power supply conductor 44. The loading at node 196 increases by capacitor 234 through transmission gate 230. The value of capacitors 228 and 234 determine the steps of frequency decrease.

Figure 5:
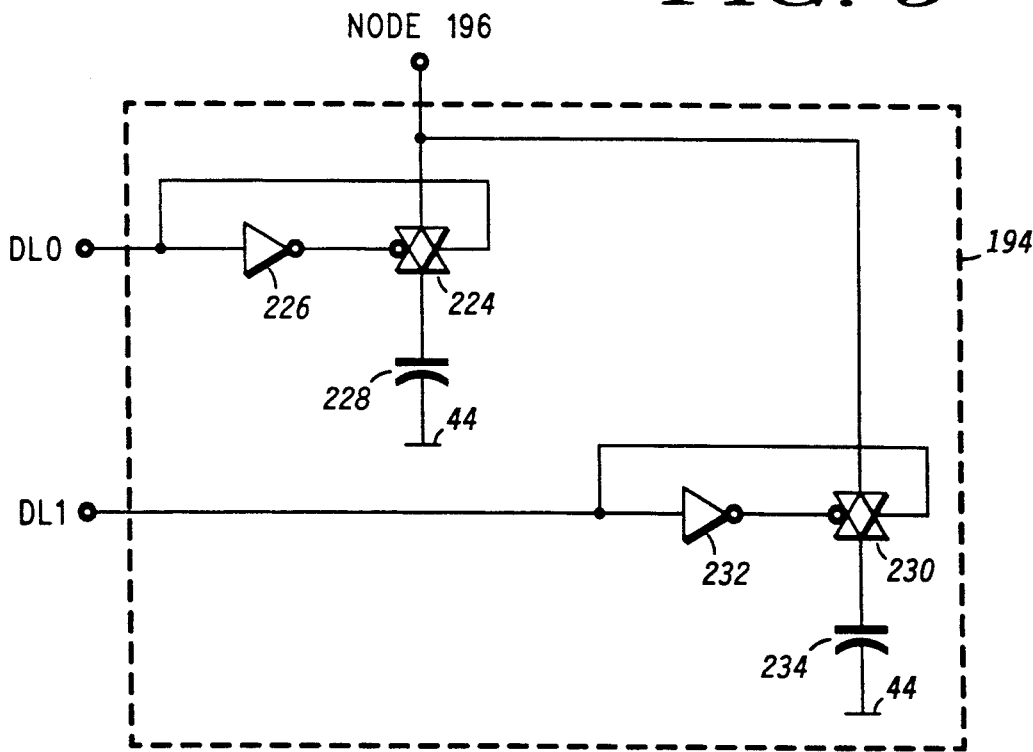
FIG. 5 is a schematic diagram illustrating the digital loads of FIG. 4.

Digital loads 204 and 212 follow a similar construction as described for digital load 194 in FIG. 5. The loading process continues with load control circuit 36 activating the DL2, DL3, DL4 and DL5 signals sequentially until VCO 22 decreases to the desired 200 MHz operating frequency. In practice, many more capacitive loads, say nine capacitors per node, may be connected to nodes 196 and 206 and output 24 of VCO 22. Load control circuit 36 must supply one load control signal for each capacitive load; twenty-seven for nine capacitors connected to each of three nodes. With twenty-seven capacitors each of value 0.1 picofarads, the overall adjustment range of VCO 22 is 200-860 MHz in non-linear steps ranging from 50 MHz when operating above 600 MHz to steps of 80 MHz when operating closer to 200 MHz. Additional loading capacitors and/or greater frequency steps may be used depending on the frequency spread between worst case processing and high temperature environment and best case processing and low temperature environment. Actually, frequency range detector 34 should be designed to detect frequencies slightly higher than 200 MHz, say 230 MHz, because the temperature of the IC may increase after normal operation begins. Furthermore, the higher frequency ensures that at least one capacitive load is activated to slow down VCO 22.

Figure 6:
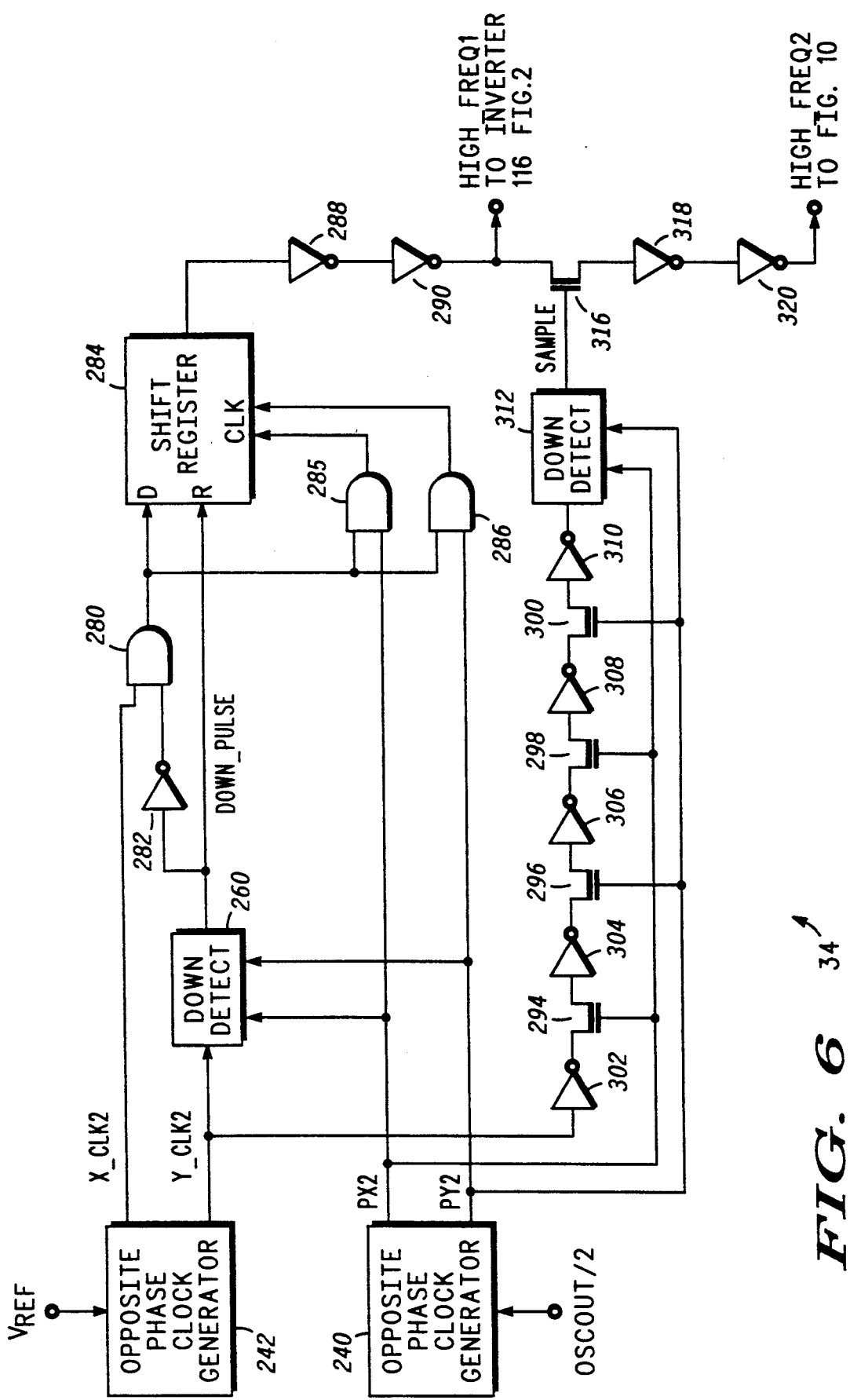
FIG. 6 is a schematic and block diagram illustrating the frequency range detector of FIG. 1.
Figure 7:
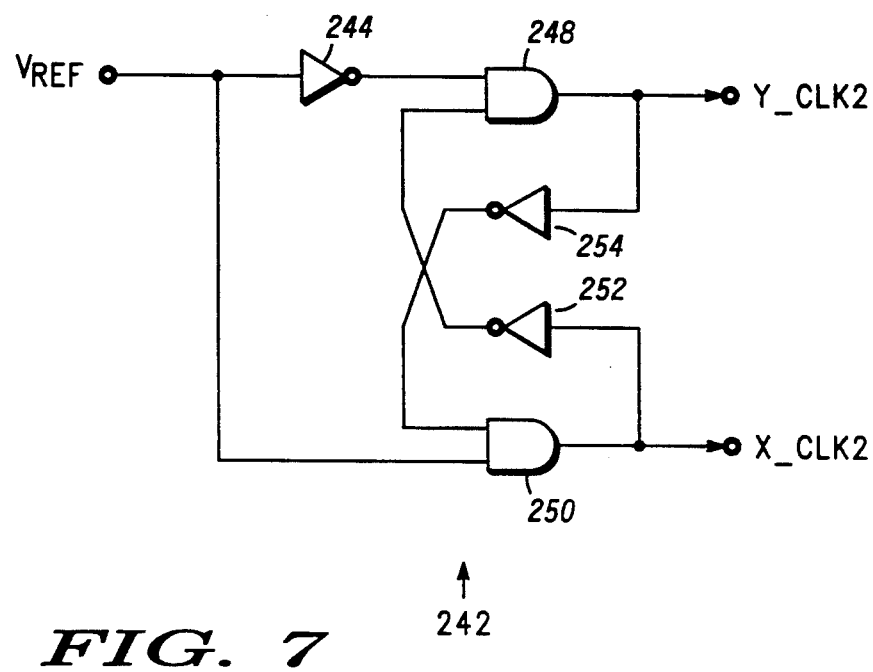
FIG. 7 is a schematic diagram illustrating the opposite phase clock generator of FIG. 6.

To monitor the output frequency of VCO 22, the OSCOUT signal is divided by one-half through divide-by-N circuit 30 and applied as OSCOUT/2 to opposite phase clock generator 240 for providing PX2 and PY2 clock signals, as shown in FIG. 6. Opposite phase clock generator 240 may follow the same construction described in FIG. 3. The input signal $V_{REF}$ is applied to opposite phase clock generator 242 for providing X_CLK2 and Y_CLK2 clock signals. Opposite phase clock generator 242 is further described in FIG. 7 where the input signal $V_{REF}$ is inverted by inverter 244 and applied at a first input of AND gate 248 which provides the Y_CLK2 clock signal at its output. The input signal $V_{REF}$ is also applied at a first input of AND gate 250 which provides the X_CLK2 clock signal at its output. The X_CLK2 clock signal is complemented by inverter 252 and applied at a second input of AND gate 248. The Y_CLK2 clock signal is complemented by inverter 254 and applied at a second input of AND gate 250.

When the input signal $V_{REF}$ is logic zero, the X_CLK2 clock signal at the output of AND gate 250 goes to logic zero. AND gate 248 receives logic ones from the outputs of inverters 244 and 252 for providing a logic one Y_CLK2 clock signal. When the input signal $V_{REF}$ goes to logic one, the Y_CLK2 clock signal goes to logic zero because of inverter 244. AND gate 250 receives logic ones from the input signal $V_{REF}$ and the output of inverter 254 for providing a logic one X_CLK2 clock signal. Hence, the X_CLK2 and Y_CLK2 clock signals are opposite phase operating at the frequency of the input signal $V_{REF}$.

Figure 8:
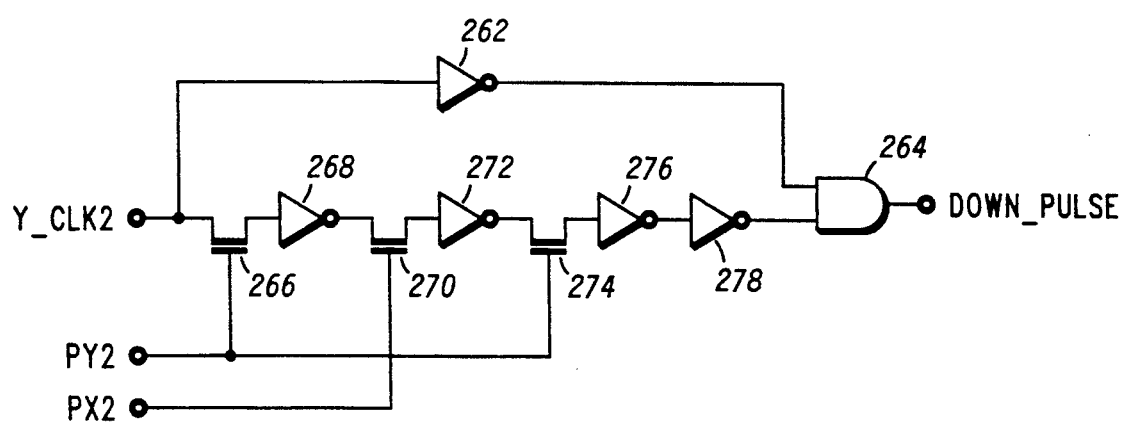
FIG. 8 is a schematic diagram illustrating the down detector of FIG. 6.

Returning to FIG. 6, the X_CLK2 and Y_CLK2 clock signals operate at 2.0 MHz with a 500 nanosecond (ns) period while the PX2 and PY2 clock signals operate at 100 MHz with a 10 ns period. Down detect circuit 260 operates in response to the PX2 and PY2 clock signals and produces a 10 ns logic one DOWN_PULSE upon detecting a zero-going transition of the Y_CLK2 clock signal. Further detail of down detect circuit 260 is shown in FIG. 8. When the Y_CLK2 clock signal is logic one at time to of FIG. 9, the output of inverter 262 is logic zero and the DOWN_PULSE signal at the output of AND gate 264 is logic zero, see FIG. 8 The logic one Y_CLK2 clock signal passes through transistor 266 when the PX2 clock signal is logic one. Inverter 268 complements the Y_CLK2 clock signal and transistor 270 passes the complemented Y_CLK2 clock signal when the PY2 clock signal becomes logic one. The Y_CLK2 clock signal returns to logic one at the output of inverter 272 and passes through transistor 274 during the following high state of the PX2 clock signal. After two more inversions through inverters 276 and 278, the logic one Y_CLK2 clock signal arrives at a first input of AND gate 264. The DOWN PULSE signal remains logic zero because of the logic zero at its second input.

Figure 9:
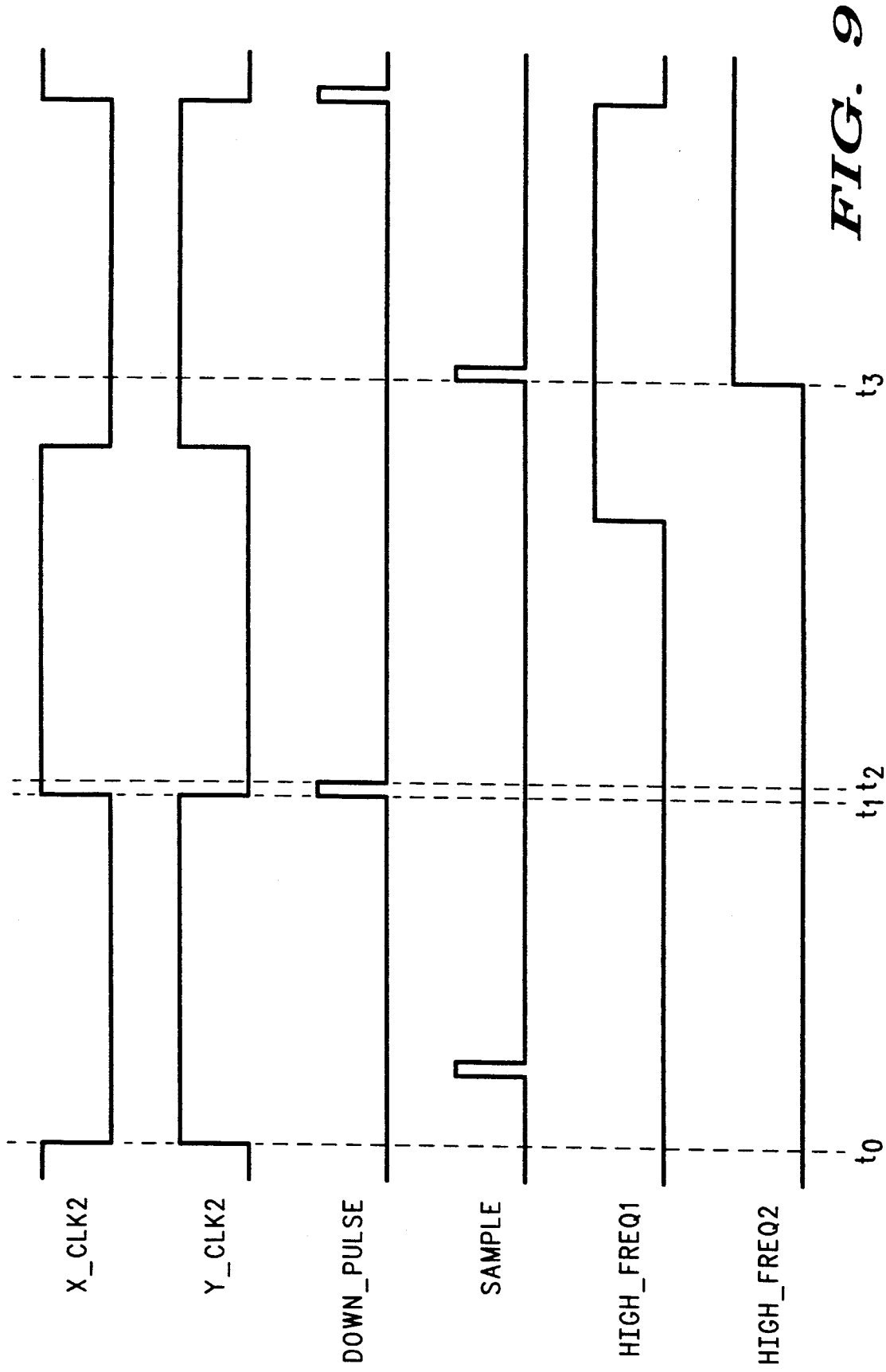
FIG. 9 is a waveform plot useful in the explanation of the frequency range detector of FIG. 6.

When the Y_CLK2 clock signal transitions to logic zero at time $t_1$ of FIG. 9, the output of inverter 262 goes to logic one and the DOWN_PULSE signal at the output of AND gate 264 switches to logic one because the output of inverter 278 is still logic one at time $t_1$, see FIG. 9. After one full period of the PX2 clock signal (logic one-to-logic zero-to-logic one), the logic zero Y_CLK2 passes through transistors 266, 270 and 274 and inverters 268, 272, 276 and 278 and arrives at the first input of AND gate 264. The DOWN_PULSE signal returns to logic zero at time $t_2$. The Y_CLK2 clock signal must switch back to logic one to preset the output of inverter 278 to logic one before the next logic one DOWN_PULSE signal may occur. Thus, the DOWN_PULSE signal goes to logic one for approximately one period of the PX2 clock signal at each zero-going transition of the Y_CLK2 clock signal.

The X_CLK2 signal is applied at a first input of AND gate 280 as shown in FIG. 6. The DOWN_PULSE signal is inverted by inverter 282 and applied at a second input of AND gate 280. Shift register 284 receives data from the output of AND gate 280 and shifts the data along a serial string of twenty-five bit locations in response to the PX2 and PY2 clock signals. AND gate 285 passes the PX2 clock signal to shift register 284 and AND gate 286 passes the PY2 clock signal to shift register 284 when the output of AND gate 280 is logic one. The last bit location of shift register 284 is buffered through inverters 288 and 290 for providing a HIGH_FREQ1 signal. A logic one DOWN_PULSE resets the 25-bits of shift register 284 to logic zero, for example, at time $t_1$ of FIG. 9.

After time $t_2$ of FIG. 9, the X_CLK2 clock signal is logic one and the output of inverter 282 is logic one allowing the data input of shift register 284 to receive a logic one. The PX2 and PY2 clock signals begin shifting the logic ones along shift register 284 during the high state of the X_CLK2 clock signal. Recall the OSCOUT/2 signal is one-half the output frequency of VCO 22 while the X_CLK2 and Y_CLK2 clock periods are 500 ns. The high state of the X_CLK2 clock signal is 250 ns. If the OSCOUT/2 frequency is higher than 200 MHz, then the PX2 and PY2 clock periods are less than 10 ns and the logic ones arrive at the 25th-bit location of shift register 284 before the X_CLK2 clock signal switches back to logic zero. The HIGH_FREQ1 signal goes to logic one. Once the X_CLK2 clock signal switches to logic zero, the output of AND gate 280 goes to logic zero and disables further clocks from reaching shift register 284 by way of AND gates 285 and 286. The last value of the 25th-bit location of shift register 284 remains as the HIGH_FREQ1 signal during the low state of the X_CLK2 clock signal. Alternately, if the OSCOUT/2 signal is operating at 100 MHz as desired, then the PX2 and PY2 clock periods are 10 ns and the 25th-bit location of shift register 284 is still logic zero when the X_CLK2 clock signal switches back to logic zero. The HIGH_FREQ1 signal also goes to inverter 116 of FIG. 2 to keep transistor 64 of FIG. 2 conducting to maintain $V_{DD}$ at loop node 18 during the time that frequency range detector 34 and load control circuit 36 are adjusting the loading on VCO 22 to achieve the desired operating frequency. Once VCO 22 is operating at 200 MHz, the HIGH_FREQ1 signal goes to logic zero and turns off transistor 64.

In practice, shift register 284 may be twenty-nine bits wide to ensure VCO 22 does not go below 200 MHz. A longer shift register 284 allows a higher frequency OSCOUT/2 signal without shifting a logic one to the last bit location during the time that the X_CLK2 clock signal is logic one. The result is less loading and correspondingly a higher output frequency for VCO 22.

The actual decision whether VCO 22 is operating at the desired frequency occurs with the state of the HIGH_FREQ2 signal at occurrence of the SAMPLE pulse. The Y_CLK2 clock signal is delayed through the delay circuit comprising transistors 294, 296, 298 and 300, and inverters 302, 304, 306, 308 and 310. The gates of transistors 294 and 298 receive the PX2 clock signal, while the gates of transistors 296 and 300 receive the PY2 clock signal. Down detect circuit 312 follows a similar construction described circuit 260 in FIG. 8 and produces a 10 ns logic one pulse a predetermined delay after the positive-going edge of the Y_CLK2 clock signal.

The Y_CLK2 clock signal is inverted by inverter 302 and passes through transistor 294 during the high state of the PX2 clock signal. The Y_CLK2 clock signal is inverted again by inverter 304 and passes through transistor 296 during the high state of the PY2 clock signal. The double inversion repeats through inverters 306 and 308 and transistors 298 and 300 during the next high states of the PX2 and PY2 clock signal, respectively. Inverter 310 provides an odd number of inversions of the Y_CLK2 clock signal whereby down detect circuit 312 produces a logic one pulse two PX2 and PY2 clock periods after the positive-going edge of the Y_CLK2 clock signal. Down detect circuit 312 generates a logic one SAMPLE pulse at time $t_3$ of FIG. 9 to enable transistor 316 and pass the HIGH_FREQ1 signal through inverters 318 and 320 as the HIGH_FREQ2 signal, see FIG. 9. If the HIGH_FREQ2 signal is logic one after the SAMPLE pulse, then load control circuit 36 issues the next digital load signal to increment the loading on VCO 22. If the HIGH_FREQ2 signal is logic zero after the SAMPLE pulse, then VCO 22 is operating at the desired frequency.

Figure 10:
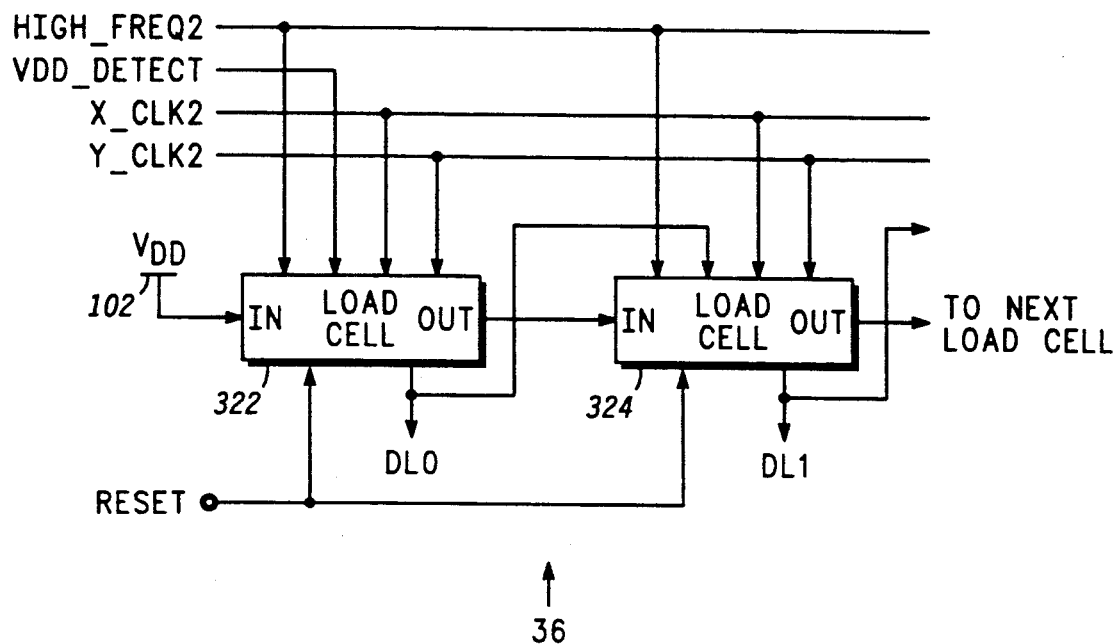
FIG. 10 is a block diagram illustrating the load control circuit of FIG. 1.

Turning to FIG. 10, load control circuit 36 is shown with load cell 322 receiving the X_CLK2 and Y_CLK2 clock signals, the HIGH_FREQ2 signal, the VDD_DETECT signal, and the RESET signal. Load cell 324 receives the X_CLK2 and Y_CLK2 clock signals, the HIGH_FREQ2 signal, the RESET signal, and the DL0 control signal from load cell 322. Load cell 322 includes an input coupled for receiving a logic one from power supply conductor 102. A first output of load cell 322 is coupled to an input of load cell 324, while a second output of load cell 322 provides the digital load control signal DL0. A first output of load cell 324 is coupled to an input of the next load cell, while a second output of load cell 324 provides the digital load control signal DL1. Load control circuit 36 includes four other load cells (not shown) for providing the digital load control signals DL2, DL3, DL4 and DL5. The load cells each follow a similar construction with the exception that the input of load cell 322 receives a fixed logic one. In addition, load cell 324 and the remaining load cells receive the previous load control signal instead of the VDD_DETECT signal.

Figure 11:
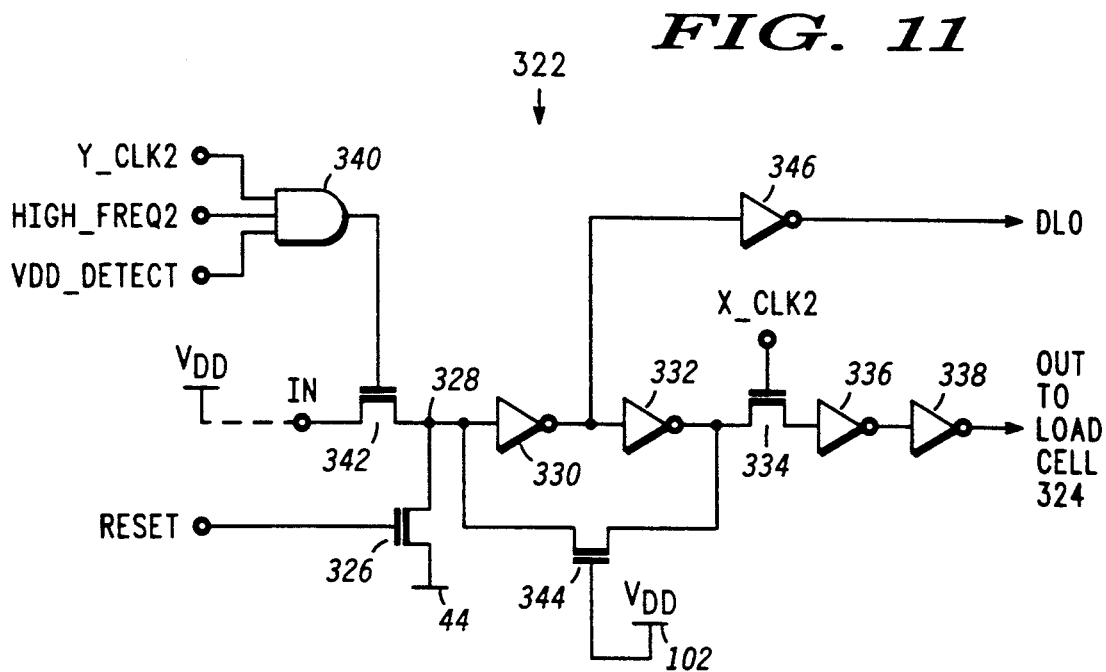
FIG. 11 is a schematic diagram illustrating the load cell of FIG. 10.

Consider the operation of load cell 322 illustrated in FIG. 11. A logic one RESET signal turns on transistor 326 and pulls node 328 to logic zero from power supply conductor 44. The logic zero passes through inverters 330 and 332 and transistor 334 at the next high state of the X_CLK2 clock signal. The first output of load cell 322 goes to logic zero following inverters 336 and 338, while the DL0 signal goes to logic zero. Recall the logic one RESET signal started the initialization process through initialize-to-VDD circuit 32. The VDD_DETECT signal remains logic zero until loop node 18 reaches $V_{DD}$. The output of AND gate 340 is logic zero and transistor 342 does not conduct. Thus, a system reset sets digital load control signals DL0–DL5 to logic zero.

After system reset, the RESET signal goes to logic zero, turning off transistor 326 and releasing node 328. The VDD_DETECT signal switches to logic one after initialization of loop node 18. During the subsequent cycle of the X_CLK2 and Y_CLK2 clock signals, frequency range detector 34 checks the output frequency of VCO 22 and issues a logic one HIGH_FREQ2 signal if it is above 200 MHz. When the VDD_DETECT signal, the HIGH_FREQ2 signal and the Y_CLK2 clock signal are all logic one, AND gate 340 goes to logic one and turns on transistor 342 passing the logic one from power supply conductor 102 to node 328. The output of inverter 330 switches to logic zero, and the output of inverter 332 goes to logic one. Transistor 344 latches the logic one at the output of inverter 332 back to the input of inverter 330 to maintain the logic zero at the output of inverter 330. The DL0 signal goes to logic one following inverter 346. During the next high state of the X_CLK2 clock signal, transistor 334 turns on and passes the logic one through inverters 336 and 338 to the input of load cell 324. The logic one DL0 signal enables transmission gate 224 of FIG. 5 and increases the loading on node 196 of FIG. 4 as per the previous discussion.

During the next cycle of the X_CLK2 and Y_CLK2 clock signals, if frequency range detector 34 again determines that the output frequency of VCO 22 is too high, it issues another logic one HIGH_FREQ2 signal following the logic one SAMPLE pulse. The DL0 signal from load cell 322 provides a logic one to AND gate 340 of load cell 324 to enable transistor 342 of load cell 324. Another logic one Y_CLK2 clock signal and logic one HIGH_FREQ2 signal pass the logic one at the output of inverter 338 of load cell 322 through transistor like 342 of load cell 324 and latches internally as described in FIG. 11. The DL1 signal goes to logic one to activate transmission gate 230 of FIG. 5 and further load node 196. The output frequency of VCO 22 slows accordingly. The logic one processing through load cell 324 is latched at the output of inverter like 338 of load cell 324 following the next high state of the X—CLK2 clock signal in preparation to pass to the next load cell if necessary.

The process continues during each cycle of the X—CLK2 and Y—CLK2 clock signals enabling the digital load control signals DL2, DL3, DL4 and DL5 in sequence until VCO 22 slows to the desired operating frequency. The PX2 and PY2 clock signals extend to the proper period such that shift register 284 does not shift a logic one to its 25th-bit location during the high state of the X—CLK2 clock signal. The HIGH— FREQ1 signal remains at logic zero and the HIGH— FREQ2 signal goes to logic zero at the logic one SAMPLE pulse. The output of AND gate like 340 in the next load cell goes to logic zero and disables transistor like 342. The logic one from the preceding load cell does not pass to the next load cell. VCO 22 is operating at the desired frequency.

Furthermore, with the three inputs of AND gate 62 of FIG. 2 each at logic one, its output goes to logic one and turns off transistor 64, thereby effectively removing initialize-to-VDD circuit 32 from PLL 10. The logic one VDD—DETECT signal and the logic zero HIGH—FREQ2 signal enables charge pump 16 to control loop node 18 during normal operation.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A voltage controlled oscillator having a control input for receiving a control signal, comprising:
   a plurality of inverters serially coupled in a ring, said plurality of inverters including a first inverter having an input, an output and first and second conduction terminals;
   first current supply means having a control input and first and second outputs for providing first and second currents, said control input receiving the control signal;
   second current supply means having a control input and an output for providing a third current to said first conduction terminal of said first inverter, said control input receiving the control signal;
   a first current mirror circuit having an input coupled to said first output of said first current supply means and an output coupled to said second conduction terminal of said first inverter; and
   a second current mirror circuit having an input coupled to said second output of said first current supply means and an output coupled to said second conduction terminal of said first inverter.

2. The voltage controlled oscillator of claim 1 wherein said first current supply means includes a third output for providing a fourth current.

3. The voltage controlled oscillator of claim 2 further including a third current mirror circuit having an input coupled to said third output of said first current supply means and an output coupled to said second conduction terminal of said first inverter.

4. The voltage controlled oscillator of claim 3 wherein said first current supply means includes:
   a first transistor having a gate, a drain and a source, said gate receiving the control signal, said source being coupled to a first power supply conductor, said drain being coupled to said input of said first current mirror circuit;
   a second transistor having a gate, a drain and a source, said gate receiving the control signal, said source being coupled to said first power supply conductor, said drain being coupled to said input of said second current mirror circuit; and
   a third transistor having a gate, a drain and a source, said gate receiving the control signal, said source being coupled to said first power supply conductor, said drain being coupled to said input of said third current mirror circuit.

5. The voltage controlled oscillator of claim 4 wherein said first current supply means includes a fourth transistor having a gate, a drain and a source, said gate receiving the control signal, said source being coupled to said first power supply conductor, said drain being coupled to said first conduction terminal of said first inverter.

6. The voltage controlled oscillator of claim 5 wherein said first current mirror circuit includes:
   a fifth transistor having a gate, a drain and a source, said gate and drain being coupled together to said drain of said first transistor, said source being coupled to a second power supply conductor; and
   a sixth transistor having a gate, a drain and a source, said gate being coupled to said drain of said fifth transistor, said source being coupled to said second power supply conductor, said drain being coupled to said second conduction terminal of said first inverter.

7. The voltage controlled oscillator of claim 6 wherein said second current mirror circuit includes:
   a seventh transistor having a gate, a drain and a source, said gate and drain being coupled together to said drain of said second transistor, said source being coupled to said second power supply conductor; and
   an eighth transistor having a gate, a drain and a source, said gate being coupled to said drain of said seventh transistor, said source being coupled to said second power supply conductor, said drain being coupled to said second conduction terminal of said first inverter.

8. The voltage controlled oscillator of claim 7 wherein said third current mirror circuit includes:
   a ninth transistor having a gate a drain and a source, said gate and drain being coupled together to said drain of said third transistor, said source being coupled to said second power supply conductor; and
   a tenth transistor having a gate, a drain and a source, said gate being coupled to said drain of said ninth transistor, said source being coupled to said second power supply conductor, said drain being coupled to said second conduction terminal of said first inverter.

9. A voltage controlled oscillator having a control input for receiving a control signal, comprising:
   a first inverter having an input, an output and first and second conduction terminals;
   a second inverter having an input coupled to said output of said first inverter and having an output;

a third inverter having an input coupled to said output of said second inverter and having an output coupled to said input of said first inverter;

first current supply means having a control input and first and second outputs for providing first and second currents, said control input receiving the control signal;

second current supply means having a control input and an output for providing a third current to said first conduction terminal of said first inverter, said control input receiving the control signal;

a first current mirror circuit having an input coupled to said first output of said first current supply means and an output coupled to said second conduction terminal of said first inverter; and a second current mirror circuit having an input coupled to said second output of said first current supply means and an output coupled to said second conduction terminal of said first inverter.

10. The voltage controlled oscillator of claim 9 wherein said first current supply means includes a third output for providing a fourth current.

11. The voltage controlled oscillator of claim 10 further including a third current mirror circuit having an input coupled to said third output of said first current supply means and an output coupled to said second conduction terminal of said first inverter.

12. The voltage controlled oscillator of claim 11 wherein said first current supply means includes:

a first transistor having a gate, a drain and a source, said gate receiving the control signal, said source being coupled to a first power supply conductor, said drain being coupled to said input of said first current mirror circuit;

a second transistor having a gate, a drain and a source, said gate receiving the control signal, said source being coupled to said first power supply conductor, said drain being coupled to said input of said second current mirror circuit; and a third transistor having a gate, a drain and a source, said gate receiving the control signal, said source being coupled to said first power supply conductor, said drain being coupled to said input of said third current mirror circuit.

13. The voltage controlled oscillator of claim 12 wherein said first current supply means includes a fourth transistor having a gate, a drain and a source, said gate receiving the control signal, said source being coupled to said first power supply conductor, said drain being coupled to said first conduction terminal of said first inverter.

14. The voltage controlled oscillator of claim 13 wherein said first current mirror circuit includes:

a fifth transistor having a gate, a drain and a source, said gate and drain being coupled together to said drain of said first transistor, said source being coupled to a second power supply conductor; and a sixth transistor having a gate, a drain and a source, said gate being coupled to said drain of said fifth transistor, said source being coupled to said second power supply conductor, said drain being coupled to said second conduction terminal of said first inverter.

15. The voltage controlled oscillator of claim 14 wherein said second current mirror circuit includes:

a seventh transistor having a gate, a drain and a source, said gate and drain being coupled together to said drain of said second transistor, said source being coupled to said second power supply conductor; and an eighth transistor having a gate, a drain and a source, said gate being coupled to said drain of said seventh transistor, said source being coupled to said second power supply conductor, said drain being coupled to said second conduction terminal of said first inverter.

16. The voltage controlled oscillator of claim 15 wherein said third current mirror circuit includes:

a ninth transistor having a gate, a drain and a source, said gate and drain being coupled together to said drain of said third transistor, said source being coupled to said second power supply conductor; and a tenth transistor having a gate, a drain and a source, said gate being coupled to said drain of said ninth transistor, said source being coupled to said second power supply conductor, said drain being coupled to said second conduction terminal of said first inverter.

17. A voltage controlled oscillator having a control input for receiving a control signal, comprising:

a plurality of inverters serially coupled in a ring, said plurality of inverters including a first inverter having an input, an output and first and second conduction terminals;

a first transistor having a gate, a drain and a source, said gate receiving the control signal, said source being coupled to a first power supply conductor;

a second transistor having a gate, a drain and a source, said gate receiving the control signal, said source being coupled to said first power supply conductor;

a third transistor having a gate, a drain and a source, said gate receiving the control signal, said source being coupled to said first power supply conductor;

a fourth transistor having a gate, a drain and a source, said gate receiving the control signal, said source being coupled to said first power supply conductor, said drain being coupled to said first conduction terminal of said first inverter;

a first current mirror circuit having an input coupled to said drain of said first transistor and an output coupled to said second conduction terminal of said first inverter;

a second current mirror circuit having an input coupled to said drain of said second transistor and an output coupled to said second conduction terminal of said first inverter; and a third current mirror circuit having an input coupled to said drain of said third transistor and an output coupled to said second conduction terminal of said first inverter.

18. The voltage controlled oscillator of claim 17 wherein said first current mirror circuit includes:

a fifth transistor having a gate, a drain and a source, said gate and drain being coupled together to said drain of said first transistor, said source being coupled to a second power supply conductor; and a sixth transistor having a gate, a drain and a source, said gate being coupled to said drain of said fifth transistor, said source being coupled to said second power supply conductor, said drain being coupled to said second conduction terminal of said first inverter.

19. The voltage controlled oscillator of claim 18 wherein said second current mirror circuit includes:
- a seventh transistor having a gate, a drain and a source, said gate and drain being coupled together to said drain of said second transistor, said source being coupled to said second power supply conductor; and
- an eighth transistor having a gate, a drain and a source, said gate being coupled to said drain of said seventh transistor, said source being coupled to said second power supply conductor, said drain being coupled to said second conduction terminal of said first inverter.

20. The voltage controlled oscillator of claim 19 wherein said third current mirror circuit includes:
- a ninth transistor having a gate, a drain and a source, said gate and drain being coupled together to said drain of said third transistor, said source being coupled to said second power supply conductor; and
- a tenth transistor having a gate, a drain and a source, said gate being coupled to said drain of said ninth transistor, said source being coupled to said second power supply conductor, said drain being coupled to said second conduction terminal of said first inverter.

* * * * *